(12) United States Patent
James

(10) Patent No.: US 7,602,318 B1
(45) Date of Patent: Oct. 13, 2009

(54) METHOD AND APPARATUS FOR IMPROVED EFFICIENCY IN PROTOCOLS USING CHARACTER CODING

(75) Inventor: Robert James, San Jose, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 8 days.

(21) Appl. No.: 11/462,973

(22) Filed: Aug. 7, 2006

(51) Int. Cl.
*H03M 5/00* (2006.01)

(52) U.S. Cl. .......................................... 341/58; 341/60

(58) Field of Classification Search ............... 341/58–60
See application file for complete search history.

(56) References Cited

U.S. PATENT DOCUMENTS

| | | | | |
|---|---|---|---|---|
| 4,486,739 A | * | 12/1984 | Franaszek et al. | 341/59 |
| 4,939,735 A | * | 7/1990 | Fredericks et al. | 714/798 |
| 5,835,730 A | * | 11/1998 | Grossman et al. | 709/247 |
| 6,198,413 B1 | * | 3/2001 | Widmer | 341/59 |
| 6,650,638 B1 | * | 11/2003 | Walker et al. | 370/389 |
| 6,718,491 B1 | * | 4/2004 | Walker et al. | 714/701 |
| 7,274,315 B2 | * | 9/2007 | Baumer | 341/95 |

* cited by examiner

*Primary Examiner*—Khai M Nguyen
(74) *Attorney, Agent, or Firm*—Heimlich Law; Alan Heimlich, Esq.

(57) ABSTRACT

A method and apparatus for improved efficiency in protocols using character coding have been disclosed.

5 Claims, 8 Drawing Sheets

| No explicit indicator for a start of coded data sequence 602 | No explicit indicator for information about coded data sequence 603 | Coded Data Sequence 604 | Pre-specified code value for 8B/10B coded data sequence |
|---|---|---|---|
| | | | K23.7, K27.7, K28.1, K28.2, K28.4, K28.6, K28.7, K29.7, and K30.7 |

| Pre-specified code value (indicates information about coded data sequence) 302 | Coded Data Sequence 304 |

FIG. 3

| Code Value 402 | Packet 404 |

FIG. 4

| No explicit indicator for a start of coded data sequence 502 | Coded Data Sequence 504 |

FIG. 5

| No explicit indicator for a start of coded data sequence 602 | No explicit indicator for information about coded data sequence 603 | Coded Data Sequence 604 |

FIG. 6

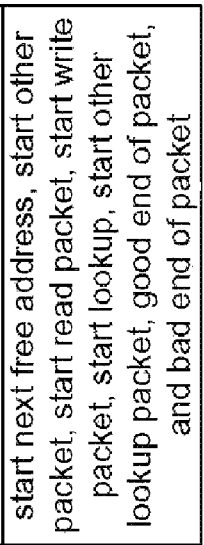

| Pre-specified code value for 8B/10B coded data sequence | |
|---|---|
| K23.7, K27.7, K28.1, K28.2, K28.4, K28.6, K28.7, K29.7, and K30.7 | |

FIG. 7

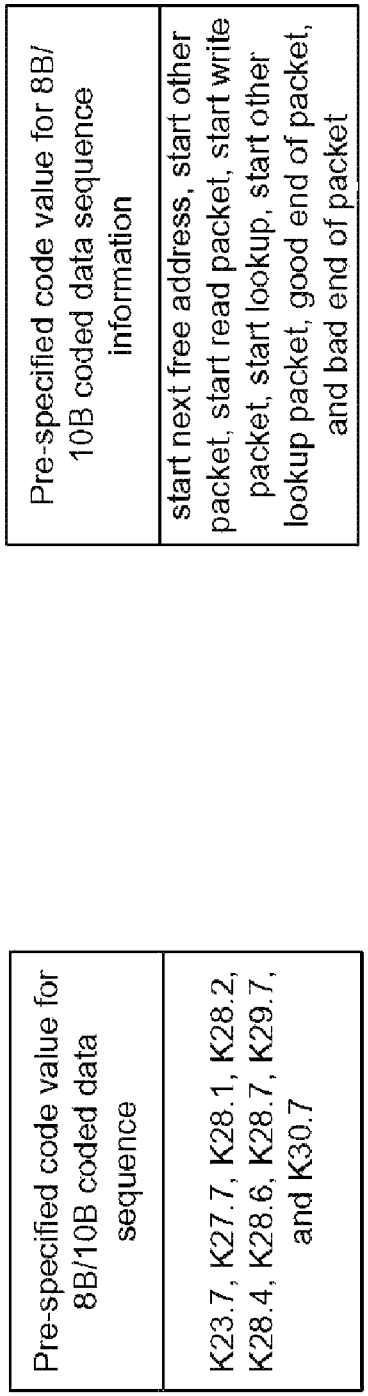

| Pre-specified code value for 8B/10B coded data sequence | information |
|---|---|
| | start next free address, start other packet, start read packet, start write packet, start lookup, start other lookup packet, good end of packet, and bad end of packet |

FIG. 8

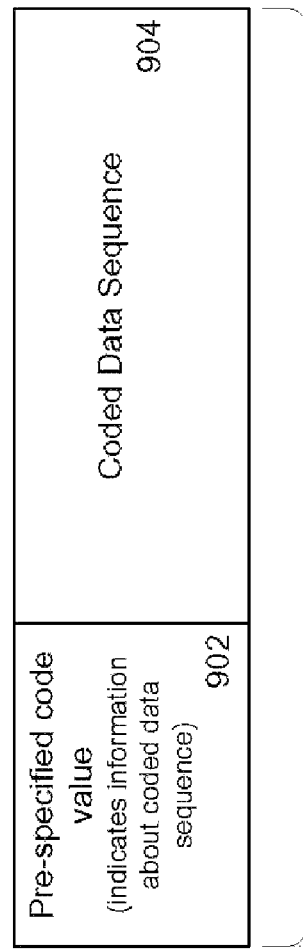

Pre-specified code value 902 (indicates information about coded data sequence)

Coded Data Sequence 904

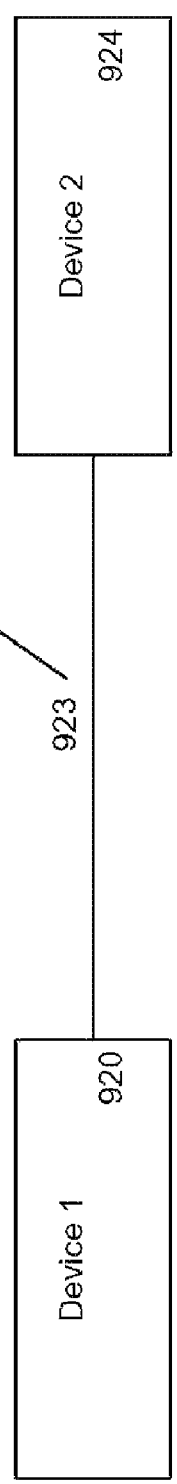

Device 1 920 —— 923 —— Device 2 924

FIG. 9

| | |
|---|---|
| Pre-specified code value is K23.7 and indicates that coded data sequence is start next free address 1702 | Coded Data Sequence 1704 |

FIG. 17

| | |
|---|---|
| Pre-specified code value is K28.7 and indicates that coded data sequence is start other lookup packet 1802 | Coded Data Sequence 1804 |

FIG. 18

METHOD AND APPARATUS FOR IMPROVED EFFICIENCY IN PROTOCOLS USING CHARACTER CODING

FIELD OF THE INVENTION

The present invention pertains to protocols using character coding. More particularly, the present invention relates to a method and apparatus for improved efficiency in protocols using character coding.

BACKGROUND OF THE INVENTION

Data transmission protocols which need to have bounded disparity, run length, or DC balance often use character coding to achieve this. The coding may also be used to demarcate sequences, for example, the beginning and/or end of data packets, idle, and exception sequences. The purpose of the frame is not defined by the initial or final code character and so additional overhead is involved to do this. This may present a problem.

BRIEF DESCRIPTION OF THE DRAWINGS

The invention is illustrated by way of example and not limitation in the figures of the accompanying drawings in which:

FIG. 3 illustrates one embodiment of the invention showing a pre-specified code value and a coded data sequence;

FIG. 4 illustrates one embodiment of the invention showing a code value and a packet;

FIG. 5 illustrates one embodiment of the invention where no explicit indicator is needed to indicate the start of a coded data sequence;

FIG. 6 illustrates one embodiment of the invention where no explicit indicator is needed to indicate the start of a coded data sequence, and no explicit indicator is need to indicate information about the coded data sequence;

FIG. 7 illustrates one embodiment of the invention showing various pre-specified code values for an 8B/10B example coded data sequence;

FIG. 8 illustrates one embodiment of the invention showing various information about an 8B/10B coded data sequence;

FIG. 9 illustrates one embodiment of the invention showing a device communicating a pre-specified code value and coded data sequence to another device;

FIG. 17 illustrates one embodiment of the invention showing a K23.7 pre-specified code value that indicates the coded data sequence is start next free address; and FIG. 18 illustrates one embodiment of the invention showing a K28.7 pre-specified code value that indicates the coded data sequence is start other lookup packet.

DETAILED DESCRIPTION

Figure 1:
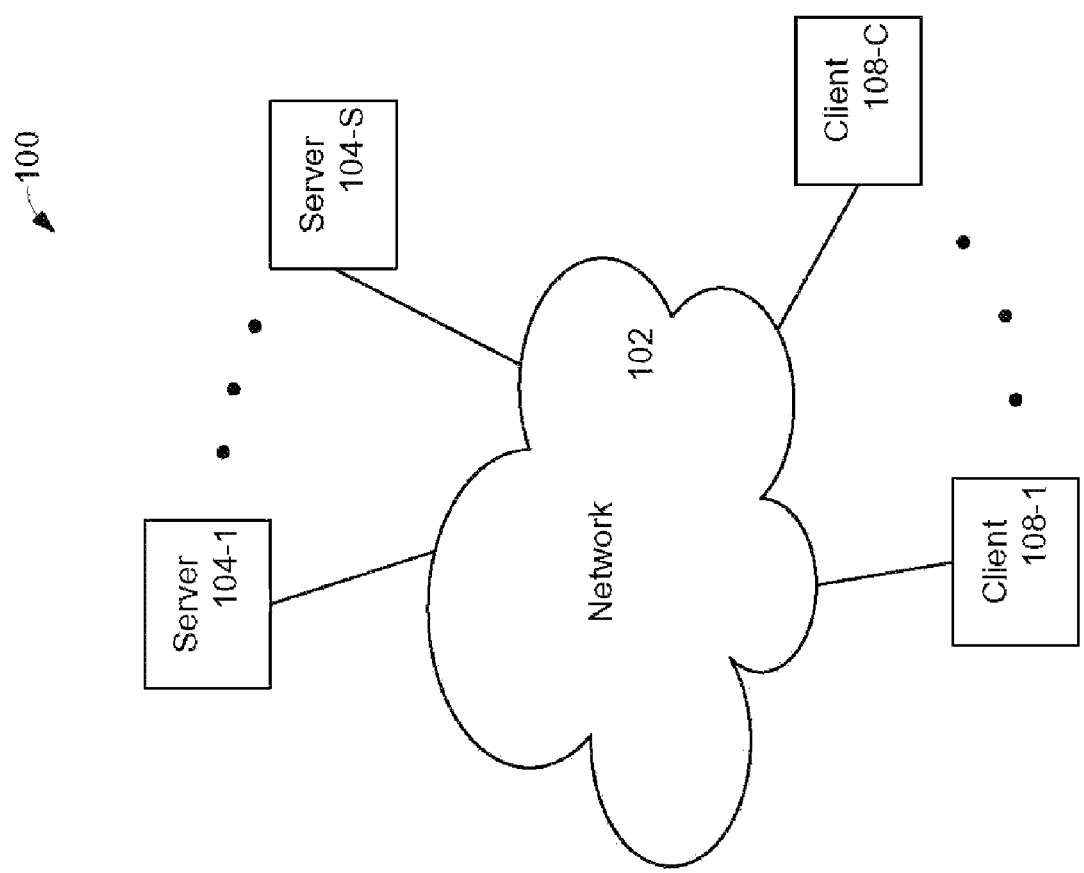
FIG. 1 illustrates a network environment in which the method and apparatus of the invention may be implemented.

The invention, as exemplified in various embodiments, illustrates improved efficiency in protocols using character coding.

For ease of discussion, embodiments of the present invention may be discussed and/or illustrated with respect to other coding schemes simply as an exemplary way of showing the improved efficiency of the present invention.

In one embodiment of the invention, use of different coded sequences in a coded stream is used to indicate the purpose of a part of the stream as contrasted with delimiting parts of a stream. One of skill in the art will immediately appreciate that efficiency is improved from not having to add a code to indicate the purpose of the stream.

Using this technique of the present invention allows additional information normally added to a part of a stream to indicate its purpose to be omitted thereby making more efficient use of bandwidth (less overhead).

In one embodiment of the present invention, a different code may be assigned to indicate the different purpose a part of the stream has, additionally one may assign coded sequences to sub-parts. Alternatively coded sequences may be used to identify only a non-unique type rather than a unique purpose.

Embodiments of the present invention may be used for any coded data patterns.

As an example to illustrate embodiments of the present invention an 8B/10B coding example will be used. 8B/10B codes bytes to 10-bit values. 256 of these are the original data. 256 are inverted data (for disparity). Many 10-bit values cannot be used since they allow excessive sequences of 1's or 0's which is bad for clock recovery. This leaves a number of 10-bit values which are unique but not required for disparity or clock recovery purposes. Some of these values are assigned to the specific purposes of 'Start of Frame' (SOF), 'End of Frame', and 'Idle'. The byte after a SOF indicates what this frame is or does. In one embodiment of the present invention, a variety of values are defined such that the value indicates what the frame is or what it does. In this embodiment then, the following byte is not required.

In one embodiment of the present invention, the technique disclosed may be applied to any device with a serial data transfer interface using a suitable coding scheme.

In one embodiment of the present invention, the present invention is well suited to products having a serial interface with limited functionality. For example, memory-based devices, such as, but not limited to, CAMs (Content Addressable Memory), etc. In other embodiments the techniques disclosed may be used in processors, switches, etc.

In one embodiment of the present invention, the technique may be used with other codings, such as, but not limited to, 64B/66B, etc.

FIG. 3 illustrates one embodiment of the invention showing a pre-specified (e.g. predefined) code value 302 which has information regarding the coded data sequence 304. For example, the code value may indicate that the coded data sequence is the start of a lookup sequence.

FIG. 4 illustrates one embodiment of the invention showing a code value 402 which has information regarding the packet 404. For example, the code value 402 may indicate that the packet 404 is the start of a write packet.

FIG. 5 illustrates how the present invention has no explicit indicator 502 for a start of a coded data sequence 504.

FIG. 6 illustrates how the present invention has no explicit indicator 602 for a start of a coded data sequence 604 and no explicit indicator 603 for information about the information in the coded data sequence 604. One of skill in the art will appreciate the savings in efficiency of the embodiment of the present invention, for example, as illustrated in FIG. 4 with a single code value 402, versus what would normally be required, as explicit indicators at locations such as 602 and 603.

FIG. 7 illustrates one embodiment of the present invention showing how the present invention may be applied to provide pre-specified code value for an 8B/10B coded data sequence. Here the pre-specified code values are K23.7, K27.7, K28.1, K28.2, K28.4, K28.6, K28.7, K29.7, and K30.7.

FIG. 8 illustrates one embodiment of the present invention showing how the present invention may be applied to provide pre-specified code value for an 8B/10B coded data sequence where the pre-specified code has information about the coded sequence, such as, but not limited to start next free address, start other packet, start read packet, start write packet, start lookup, start other lookup packet, good end of packet, and bad end of packet.

FIG. 9 illustrates one embodiment of the present invention showing how the present invention may communicate 923 a pre-specified code value 902 and an immediately following coded data sequence 904 between a device 1 920 and a device 2 924.

Figure 10:
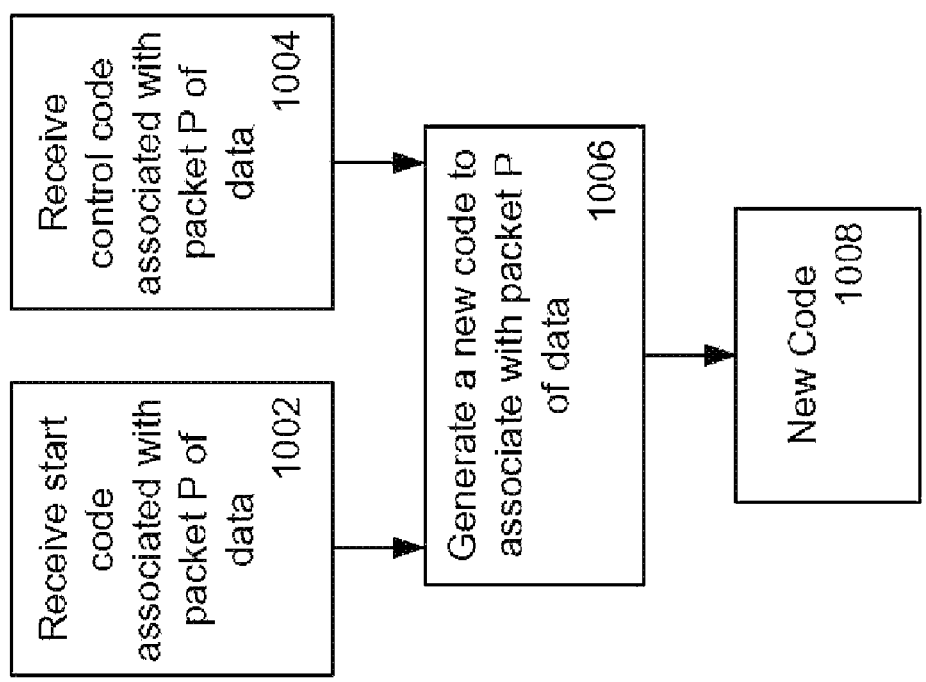
FIG. 10 illustrates one embodiment of the invention showing generating a new code.

FIG. 10 illustrates one embodiment of the present invention showing receiving a start code associated with a packet of data (P) at 1002, receiving a control code associated with the packet of data 1004, and generating a new code to associate with the packet of data 1006, and the resulting new code 1008.

Figure 11:
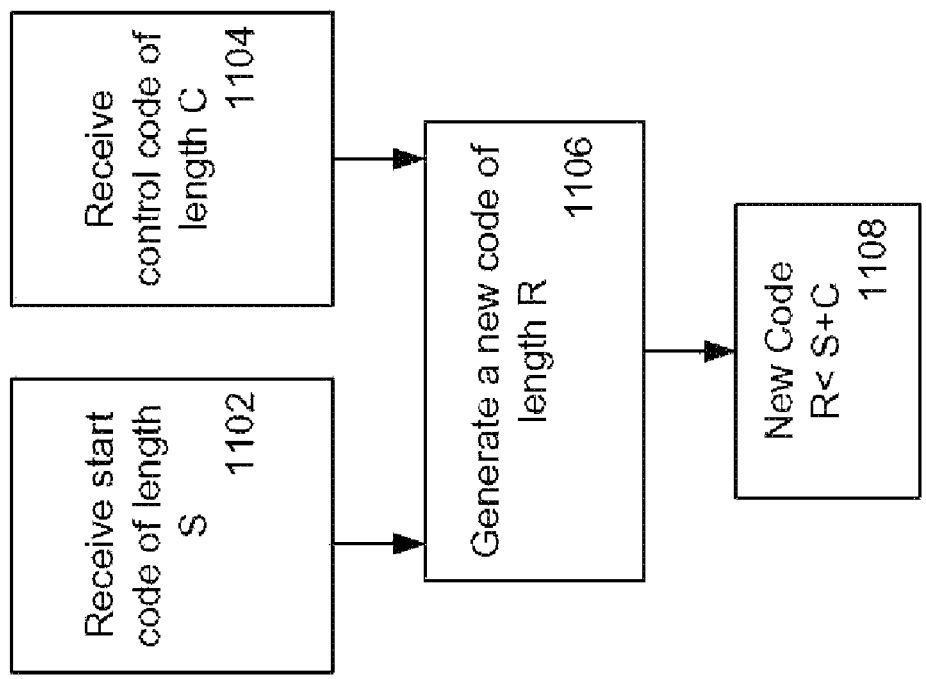
FIG. 11 illustrates one embodiment of the invention showing generating a new code of a smaller length.

FIG. 11 illustrates one embodiment of the present invention showing receiving a start code of length S at 1102, receiving a control code of length C at 1104, and generating a new code of length R at 1106, and the new code length R is less than the code length S plus the code length C 1108.

Figure 12:
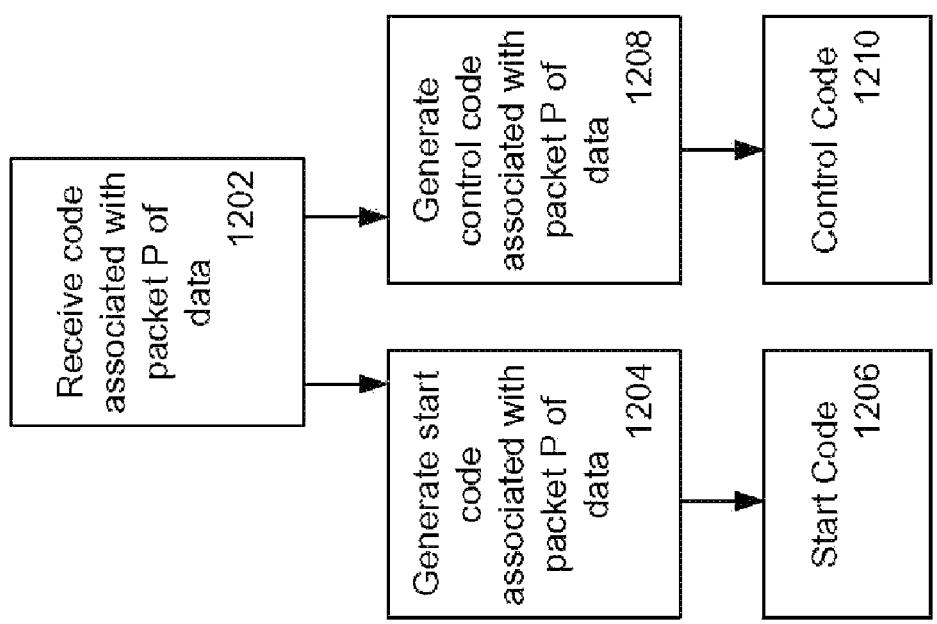
FIG. 12 illustrates one embodiment of the invention showing generating a start code and a control code.

FIG. 12 illustrates one embodiment of the present invention showing receiving a code associated with a packet of data 1202, generating a start code associated with the packet of data 1204, and outputting the start code 1206, and generating a control code associated with the packet of data 1208, and outputting the control code 1210.

Figure 13:
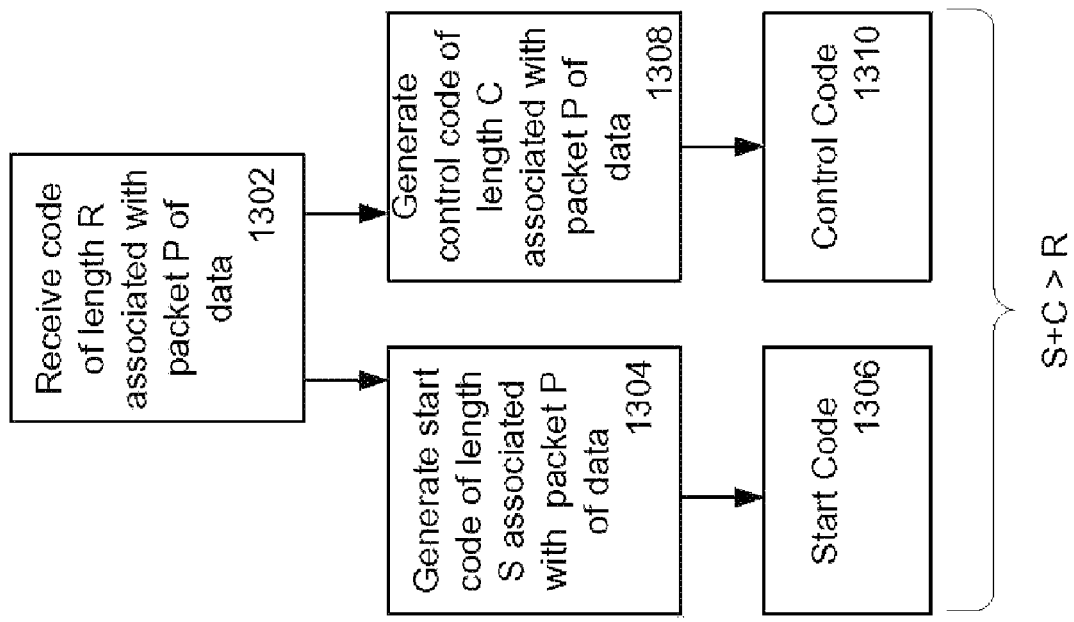
FIG. 13 illustrates one embodiment of the invention showing generating a start code and a control code where their combined length is greater than a received code.

FIG. 13 illustrates one embodiment of the present invention showing receiving a code of length R associated with a packet of data 1302, generating a start code of length S associated with the packet of data 1304, and outputting the start code 1306, and generating a control code of length C associated with the packet of data 1308, and outputting the control code 1310, and S+C>R.

Figure 14:
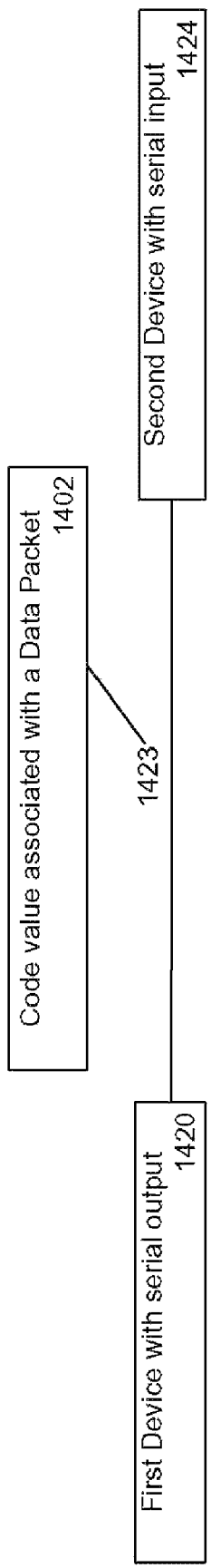
FIG. 14 illustrates one embodiment of the invention showing a first device communicating a code value associated with a data packet to a second device.

FIG. 14 illustrates one embodiment of the present invention showing how a first device with a serial output 1420 communicates via link 1423 to a second device having a serial input 1424 a code value associated with a data packet 1402.

Figure 15:
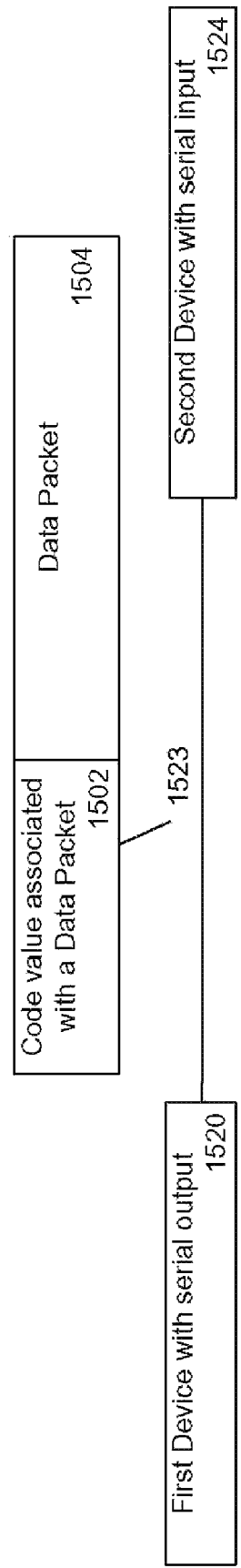
FIG. 15 illustrates one embodiment of the invention showing a first device communicating a code value associated with a data packet to a second device before the data packet.

FIG. 15 illustrates one embodiment of the present invention showing how a first device with a serial output 1520 communicates via 1523 to a second device having a serial input 1524 a code value associated with a data packet 1502 which is pre-pended to the data packet 1504 (i.e. the code value associated with a data packet 1502 is sent before the data packet 1504).

Figure 16:
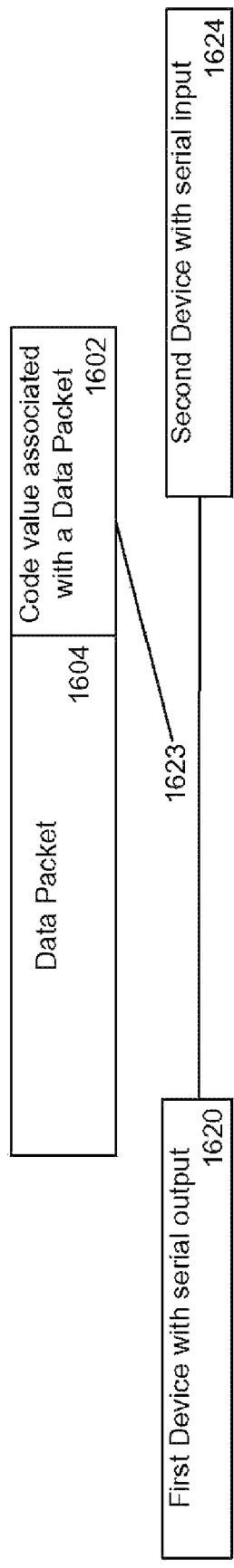
FIG. 16 illustrates one embodiment of the invention showing a first device communicating a code value associated with a data packet to a second device after the data packet.

FIG. 16 illustrates one embodiment of the present invention showing how a first device with a serial output 1620 communicates via 1623 to a second device having a serial input 1624 a code value associated with a data packet 1602 which is post-pended to the data packet 1604 (i.e. the code value associated with a data packet 1602 is sent after the data packet 1604).

For the sake of discussion numerous embodiments of the present invention have been illustrated and discussed using a serial interface. The invention is not so limited. For example, the present invention may be practiced whether it be serial, parallel, or a combination.

Thus a method and apparatus for improved efficiency in protocols using character coding have been described.

FIG. 1 illustrates a network environment 100 in which the techniques described may be applied. The network environment 100 has a network 102 that connects S servers 104-1 through 104-S, and C clients 108-1 through 108-C. More details are described below.

Figure 2:
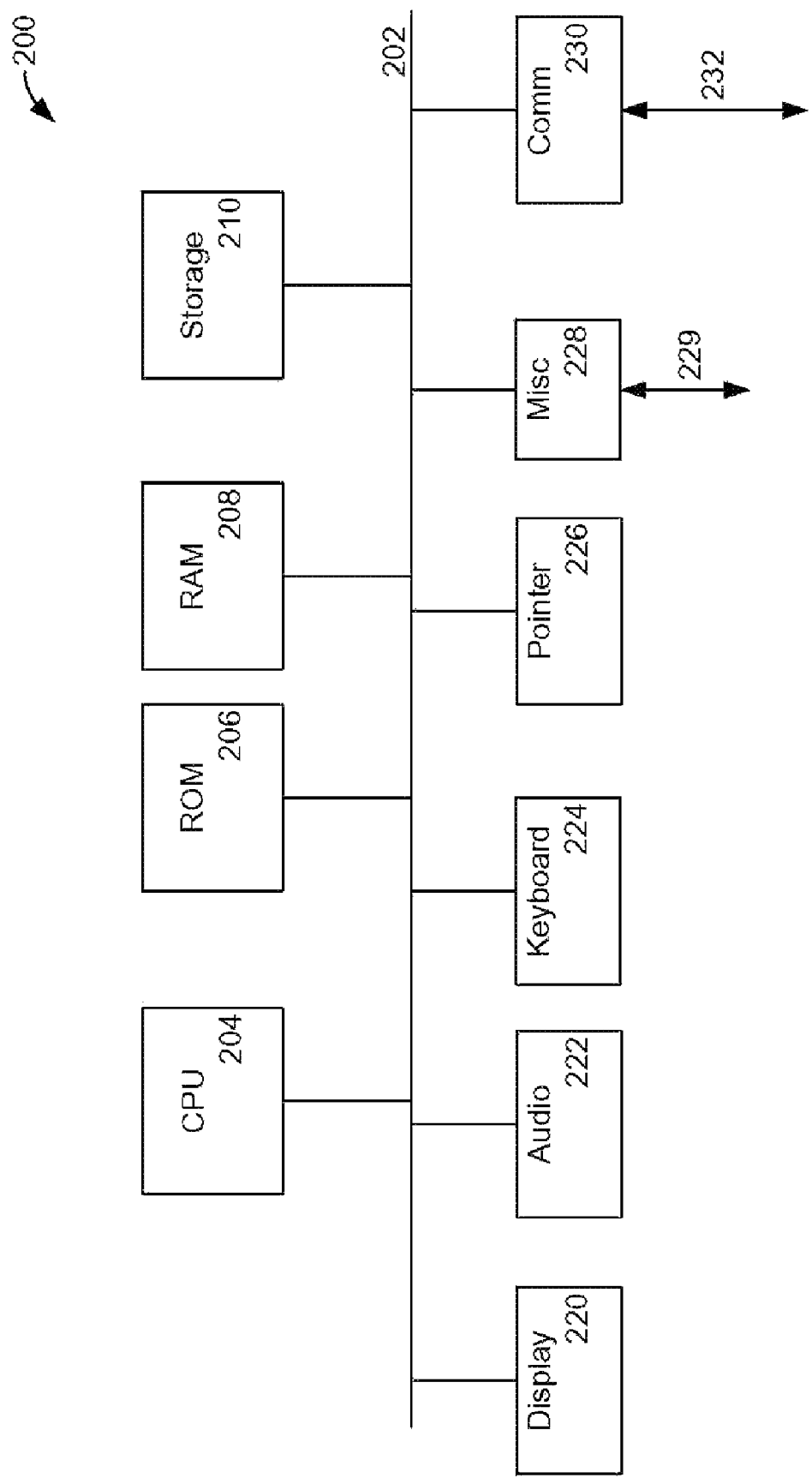
FIG. 2 is a block diagram of a computer system in which some embodiments of the invention may be used.

FIG. 2 is a block diagram of a computer system 200 in which some embodiments of the invention may be used and which may be representative of use in any of the clients and/or servers shown in FIG. 1, as well as, devices, clients, and servers in other Figures. More details are described below.

Referring back to FIG. 1, FIG. 1 illustrates a network environment 100 in which the techniques described may be applied. The network environment 100 has a network 102 that connects S servers 104-1 through 104-S, and C clients 108-1 through 108-C. As shown, several computer systems in the form of S servers 104-1 through 104-S and C clients 108-1 through 108-C are connected to each other via a network 102, which may be, for example, a corporate based network. Note that alternatively the network 102 might be or include one or more of: the Internet, a Local Area Network (LAN), Wide Area Network (WAN), satellite link, fiber network, cable network, or a combination of these and/or others. The servers may represent, for example, disk storage systems alone or storage and computing resources. Likewise, the clients may have computing, storage, and viewing capabilities. The method and apparatus described herein may be applied to essentially any type of communicating means or device whether local or remote, such as a LAN, a WAN, a system bus, etc. Thus, the invention may find application at both the S servers 104-1 through 104-S, and C clients 108-1 through 108-C.

Referring back to FIG. 2, FIG. 2 illustrates a computer system 200 in block diagram form, which may be representative of any of the clients and/or servers shown in FIG. 1. The block diagram is a high level conceptual representation and may be implemented in a variety of ways and by various architectures. Bus system 202 interconnects a Central Processing Unit (CPU) 204, Read Only Memory (ROM) 206, Random Access Memory (RAM) 208, storage 210, display 220, audio, 222, keyboard 224, pointer 226, miscellaneous input/output (I/O) devices 228, and communications 230. The bus system 202 may be for example, one or more of such buses as a system bus, Peripheral Component Interconnect (PCI), Advanced Graphics Port (ASP), Small Computer System Interface (SCSI), Institute of Electrical and Electronics Engineers (IEEE) standard number 1394 (FireWire), Universal Serial Bus (USB), etc. The CPU 204 may be a single, multiple, or even a distributed computing resource. Storage 210, may be Compact Disc (CD), Digital Versatile Disk (DVD), hard disks (HD), optical disks, tape, flash, memory sticks, video recorders, etc. Display 220 might be, for example, an embodiment of the present invention. Note that depending upon the actual implementation of a computer system, the computer system may include some, all, more, or a rearrangement of components in the block diagram. For example, a thin client might consist of a wireless hand held device that lacks, for example, a traditional keyboard. Thus, many variations on the system of FIG. 2 are possible.

For purposes of discussing and understanding the invention, it is to be understood that various terms are used by those of skill in the art to describe techniques and approaches. Furthermore, in the description, for purposes of explanation, numerous specific details are set forth in order to provide a thorough understanding of the present invention. It will be evident, however, to one of skill in the art that the present invention may be practiced without these specific details. In some instances, well-known structures and devices are shown in block diagram form, rather than in detail, in order to avoid obscuring the present invention. These embodiments are described in sufficient detail to enable those of skill in the art to practice the invention, and it is to be understood that other embodiments may be utilized and that logical, mechanical, electrical, and other changes may be made without departing from the scope of the present invention.

Some portions of the description may be presented in terms of algorithms and symbolic representations of operations on, for example, data bits within a computer memory, and/or logic circuitry. These algorithmic descriptions and representations are the means used by those of skill in the arts to most effectively convey the substance of their work to others of skill in the art. An algorithm is here, and generally, conceived to be a self-consistent sequence of acts leading to a desired result. The acts are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion, it is appreciated that throughout the description, discussions utilizing terms such as "processing" or "computing" or "calculating" or "determining" or "displaying" or the like, can refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission, or display devices.

Further, any of the methods according to the present invention can be implemented in hard-wired circuitry, by programmable logic, or by any combination of hardware and software.

An apparatus for performing the operations herein can implement the present invention. This apparatus may be specially constructed for the required purposes, or it may comprise a general-purpose computer, selectively activated or reconfigured by a computer program stored in the computer. Such a computer program may be stored in a computer readable storage medium, such as, but not limited to, any type of disk including floppy disks, hard disks, optical disks, compact disk-read only memories (CD-ROMs), and magnetic-optical disks, read-only memories (ROMs), random access memories (RAMs), electrically programmable read-only memories (EPROM)s, electrically erasable programmable read-only memories (EEPROMs), FLASH memories, magnetic or optical cards, etc., or any type of media suitable for storing electronic instructions either local to the computer or remote to the computer.

The algorithms and displays presented herein are not inherently related to any particular computer or other apparatus. Various general-purpose systems may be used with programs in accordance with the teachings herein, or it may prove convenient to construct more specialized apparatus to perform the required method. For example, any of the methods according to the present invention can be implemented in hard-wired circuitry, by programming a general-purpose processor, or by any combination of hardware and software. One of ordinary skill in the art will immediately appreciate that the invention can be practiced with computer system configurations other than those described, including hand-held devices, multiprocessor systems, microprocessor-based or programmable consumer electronics, digital signal processing (DSP) devices, set top boxes, network PCs, minicomputers, mainframe computers, and the like. The invention can also be practiced in distributed computing environments where tasks are performed by remote processing devices that are linked through a communications network.

The methods of the invention may be implemented using computer software. If written in a programming language conforming to a recognized standard, sequences of instructions designed to implement the methods can be compiled for execution on a variety of hardware platforms and for interface to a variety of operating systems. In addition, the present invention is not described with reference to any particular programming language. It will be appreciated that a variety of programming languages may be used to implement the teachings of the invention as described herein. Furthermore, it is common in the art to speak of software, in one form or another (e.g., program, procedure, application, driver, . . . ), as taking an action or causing a result. Such expressions are merely a shorthand way of saying that execution of the software by a computer causes the processor of the computer to perform an action or produce a result.

It is to be understood that various terms and techniques are used by those knowledgeable in the art to describe communications, protocols, applications, implementations, mechanisms, etc. One such technique is the description of an implementation of a technique in terms of an algorithm or mathematical expression. That is, while the technique may be, for example, implemented as executing code on a computer, the expression of that technique may be more aptly and succinctly conveyed and communicated as a formula, algorithm, or mathematical expression. Thus, one of skill in the art would recognize a block denoting A+B=C as an additive function whose implementation in hardware and/or software would take two inputs (A and B) and produce a summation output (C). Thus, the use of formula, algorithm, or mathematical expression as descriptions is to be understood as having a physical embodiment in at least hardware and/or software (such as a computer system in which the techniques of the present invention may be practiced as well as implemented as an embodiment).

A machine-readable medium is understood to include any mechanism for storing or transmitting information in a form readable by a machine (e.g., a computer). For example, a machine-readable medium includes read only memory (ROM); random access memory (RAM); magnetic disk storage media; optical storage media; flash memory devices;

electrical, optical, acoustical or other form of propagated signals (e.g., carrier waves, infrared signals, digital signals, etc.); etc.

As used in this description, "one embodiment" or "an embodiment" or similar phrases means that the feature(s) being described are included in at least one embodiment of the invention. References to "one embodiment" in this description do not necessarily refer to the same embodiment; however, neither are such embodiments mutually exclusive. Nor does "one embodiment" imply that there is but a single embodiment of the invention. For example, a feature, structure, act, etc. described in "one embodiment" may also be included in other embodiments. Thus, the invention may include a variety of combinations and/or integrations of the embodiments described herein.

Thus a method and apparatus for improved efficiency in protocols using character coding have been described.

What is claimed is:

1. A method comprising using a pre-specified code value to indicate information about an immediately following coded data sequence, wherein there is no explicit indicator for a start of said coded data sequence, wherein there is no explicit indicator for information about said coded data sequence, and wherein said pre-specified code value for a 8B/10B coded data sequence is selected from the group consisting of K23.7, K27.7, K28.1, K28.2, K28.4, K28.6, K28.7, K29.7, and K30.7.

2. The method of claim 1 wherein said pre-specified code value represents said information selected from the group consisting of start next free address, start other packet, start read packet, start write packet, start lookup, start other lookup packet, good end of packet, and bad end of packet.

3. The method of claim 2 further comprising communicating said pre-specified code value and said immediately following coded data sequence between one or more devices.

4. A method comprising using a pre-specified code value to indicate information about an immediately following coded data sequence, wherein there is no explicit indicator for a start of said coded data sequence, wherein there is no explicit indicator for information about said coded data sequence, wherein said pre-specified code value for a 8B/10B coded data sequence is K23.7, and wherein said information is start next free address.

5. A method comprising using a pre-specified code value to indicate information about an immediately following coded data sequence, wherein there is no explicit indicator for a start of said coded data sequence, wherein there is no explicit indicator for information about said coded data sequence, wherein said pre-specified code value for a 8B/10B coded data sequence is K28.7, and wherein said information is start other lookup packet.

* * * * *